United States Patent
Dunlap, Jr.

(10) Patent No.: US 7,341,199 B2
(45) Date of Patent: Mar. 11, 2008

(54) MATERIAL HANDLING SYSTEM WITH DYNAMIC SOURCE TAGGING

(75) Inventor: Joe D Dunlap, Jr., McMinnville, TN (US)

(73) Assignee: Siemens Energy & Automation, Inc., Arlington, TX (US)

( * ) Notice: Subject to any disclaimer, the term of this patent is extended or adjusted under 35 U.S.C. 154(b) by 393 days.

(21) Appl. No.: 10/988,344

(22) Filed: Nov. 12, 2004

(65) Prior Publication Data

US 2005/0098620 A1    May 12, 2005

Related U.S. Application Data

(60) Provisional application No. 60/481,628, filed on Nov. 12, 2003.

(51) Int. Cl.
*G06K 19/06*    (2006.01)
(52) U.S. Cl. ........................ 235/492; 235/435
(58) Field of Classification Search ........... 235/462.01, 235/435, 492
See application file for complete search history.

(56) References Cited

U.S. PATENT DOCUMENTS

| 4,615,757 A | 10/1986 | Treiber |
|---|---|---|
| 5,425,823 A | 6/1995 | Woodside, III |
| 5,684,275 A | 11/1997 | Tolson |
| 5,897,741 A | 4/1999 | Mills et al. |
| 6,281,795 B1 * | 8/2001 | Smith et al. ............. 340/572.1 |
| 2003/0189490 A1 | 10/2003 | Hogerton et al. |

FOREIGN PATENT DOCUMENTS

| DE | 197 50 204 A1 | 5/1999 |
|---|---|---|
| WO | WO 93/23292 | 11/1993 |

OTHER PUBLICATIONS

International Search Report (Form PCT/ISA/210) from corresponding Patent Cooperation Treaty Application No. PCT/US2004/037933, dated Mar. 17, 2005.

* cited by examiner

*Primary Examiner*—Lisa Caputo

(57) ABSTRACT

A method and apparatus of selectively applying a particular label from a plurality of different types of labels includes providing a label application apparatus that is adapted to selectively apply at least one of a plurality of different types of labels to an article. An article is identified. The label application apparatus is controlled to selectively apply at least one of a plurality of different labels to the article as a function of the identity of that article.

12 Claims, 8 Drawing Sheets

MATERIAL HANDLING SYSTEM WITH DYNAMIC SOURCE TAGGING

CROSS REFERENT TO RELATED APPLICATIONS

This application claims priority from U.S. provisional patent application Ser. No. 60/481,628, filed on Nov. 12, 2003, the disclosure of which is hereby incorporated herein by reference in its entirety.

BACKGROUND OF THE INVENTION

The present invention is directed to a material handling system and, in particular, to a label application and method for use with such material handing system. The invention is particularly adaptable for use in the application of a particular label selected from a plurality of different labels to articles being conveyed by a conveying surface of the material handling system. The invention is particularly adapted for use in the application of different labels, wherein at least one of the labels is a radio frequency identification (RFID) tag.

RFID tags provide unique identification codes for articles or a group of articles, such as carried by a pallet, carton, or the like. The advantage of an RFID tag is that it may be read remotely using radio frequency signals emitted by an RF reader which then, in turn, receives RF signals sent by the RFID tag. One difficulty with RFID tags is that the product or article upon which the tag is placed, or the packaging material for the product, can affect the performance of the tag. For example, if the article is made up of a large quantity of a liquid, such as water, bleach, or the like, the article tends to absorb signals emitted by the RFID tag, thereby distorting the signals. In a similar fashion, if the article contains an appreciable amount of metal, such as pop cans, or the like, the metal may distort the RFID signals emitted by the RFID tag. In contrast, if the article is made from a material that does not significantly absorb or reflect RFID tags, such as paper, then the article does not affect the signals emitted by the RFID tag appreciably.

RFID tags are provided by various suppliers. Some RFID tags are high performance tags that are capable of emitting relatively clear RFID signals even in the presence of distorting articles, such as articles containing a significant amount of liquid or metal. Such high quality RFID tags typically come at a premium price. Other RFID tags come at a low cost, but may be low performance tags that are not as capable of emitting clear radio frequency signals in the presence of liquids, metals, or the like. Therefore, if a supplier supplies articles having various characteristics, which differently affect the radio frequency signal generating capabilities of an RFID tag, the supplier will use the more expensive RFID tags in order to ensure that the tags will emit radio frequency signals when probed.

SUMMARY OF THE INVENTION

The present invention provides a unique technology for applying tags or labels, such as RFID tags and barcode labels, to articles that is incorporated into a material handling system.

A method and apparatus of selectively applying a particular label from a plurality of different types of labels, according to an aspect of the invention, includes providing a label application apparatus that is adapted to selectively apply at least one of a plurality of different types of labels to an article. An article is identified. The label application apparatus is controlled to selectively apply at least one of a plurality of different labels to the article as a function of the identity of that article.

A method and apparatus of applying radio frequency identification (RFID) tags to an article, according to another aspect of the invention, includes providing a conveyor having a conveying surface for conveying articles and providing a plurality of different types of RFID tags, at least some of the RFID tags having different radio frequency emitting capabilities than other of the RFID tags. A characteristic of an article is determined on the conveying surface that may affect a radio frequency signal emitted by the RFID tag. One of the pluralities of different types of RFID tags are selected as a function of the characteristic of the article and the selected RFID tag is applied to the article on the conveying surface.

These and other objects, advantages and features of this invention will become apparent upon review of the following specification in conjunction with the drawings.

DESCRIPTION OF THE PREFERRED EMBODIMENT

Figure 1:
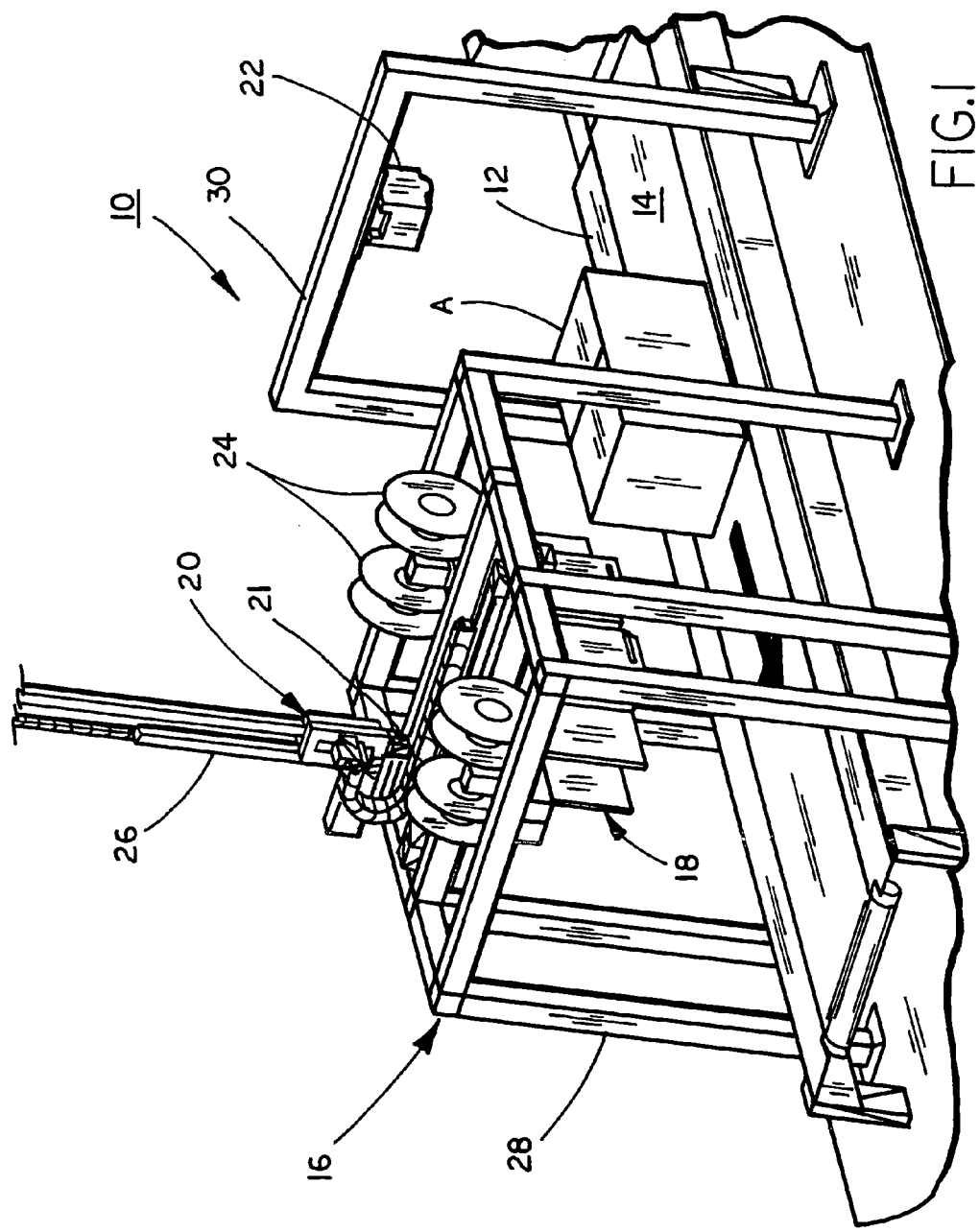
FIG. 1 is a perspective view of a label application apparatus, according to the invention.
Figure 2:
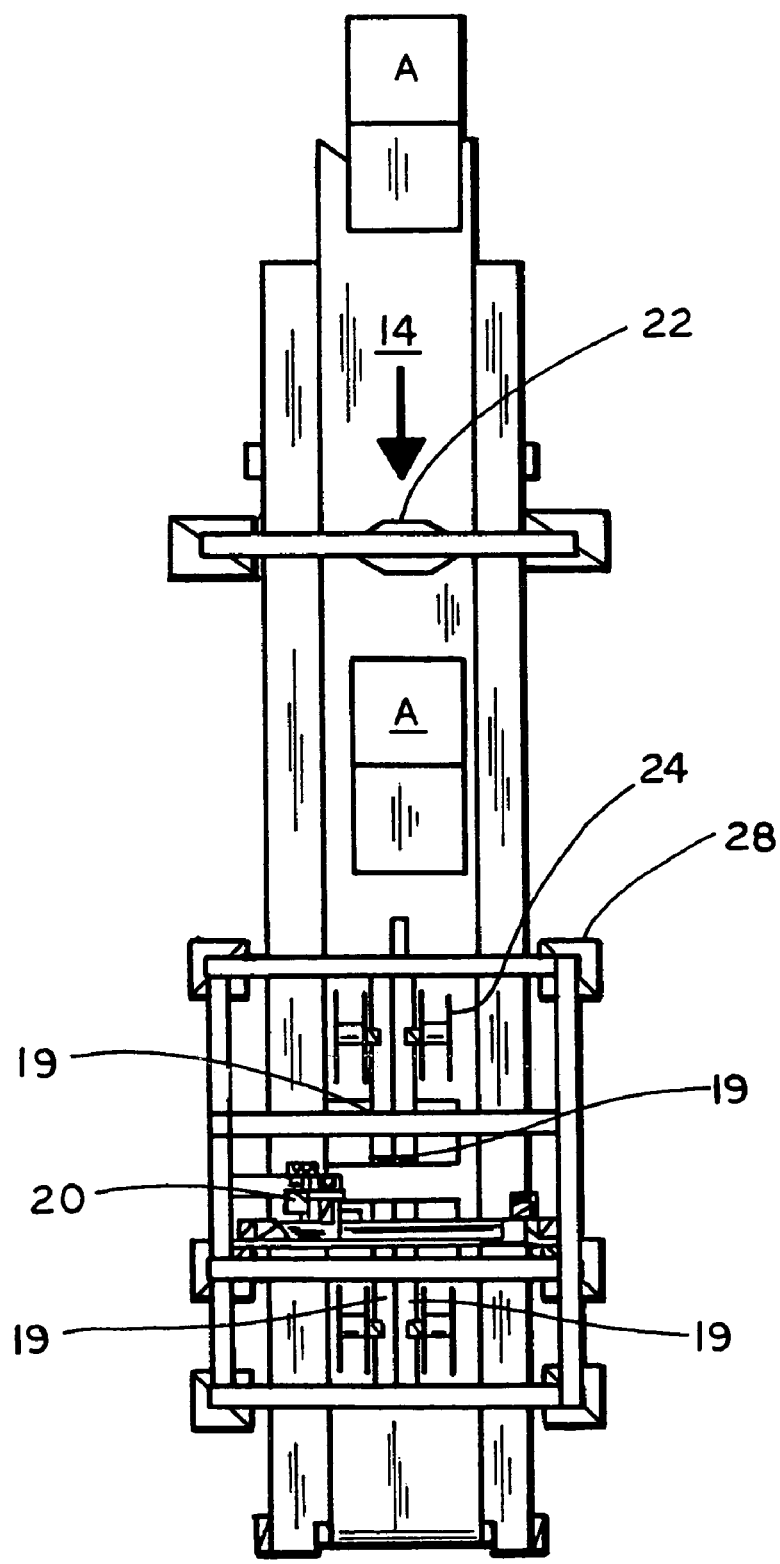
FIG. 2 is a top plan view of the apparatus in FIG. 1.
Figure 3:
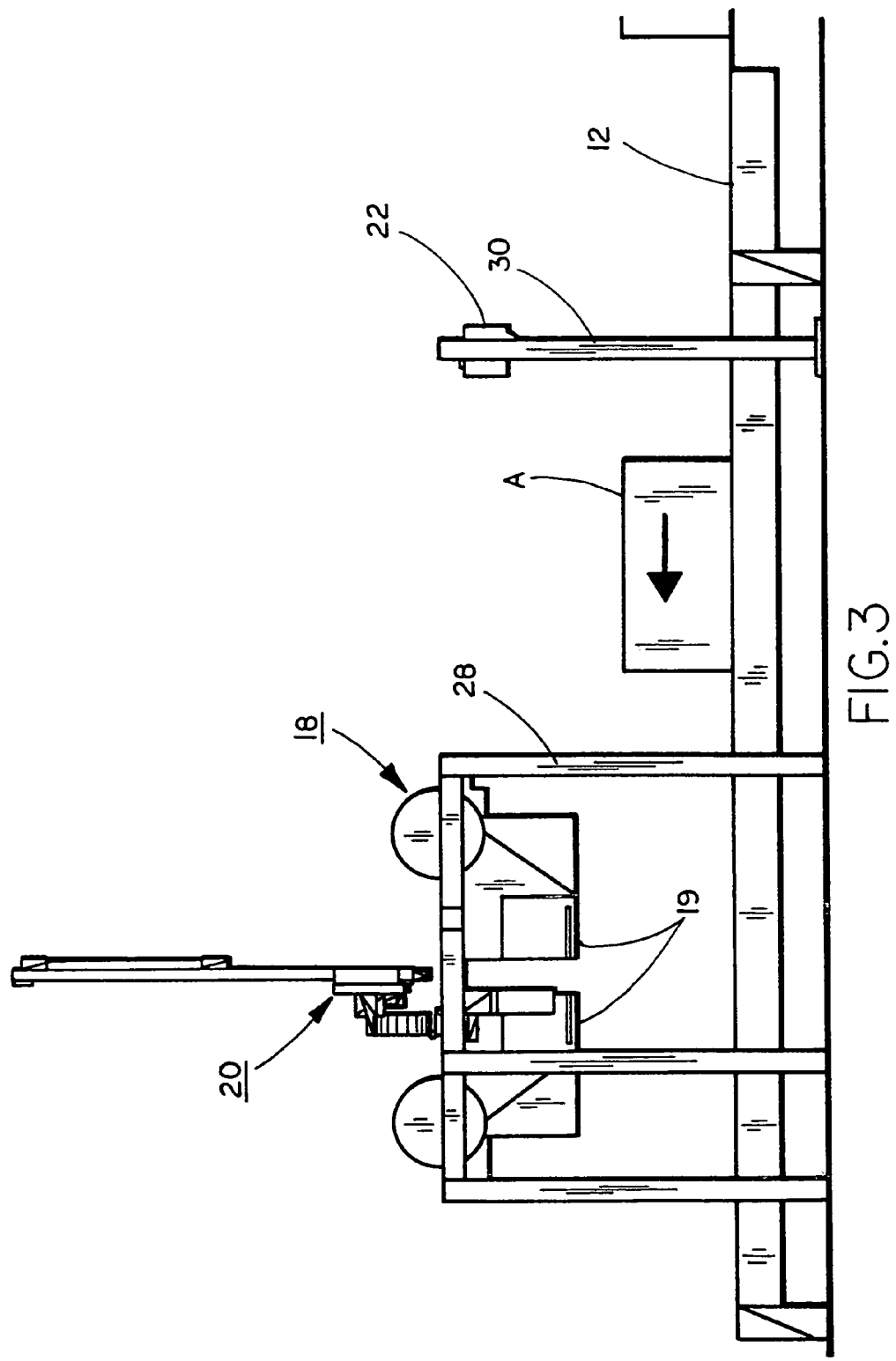
FIG. 3 is a side elevation of the apparatus in FIG. 1.
Figure 4:
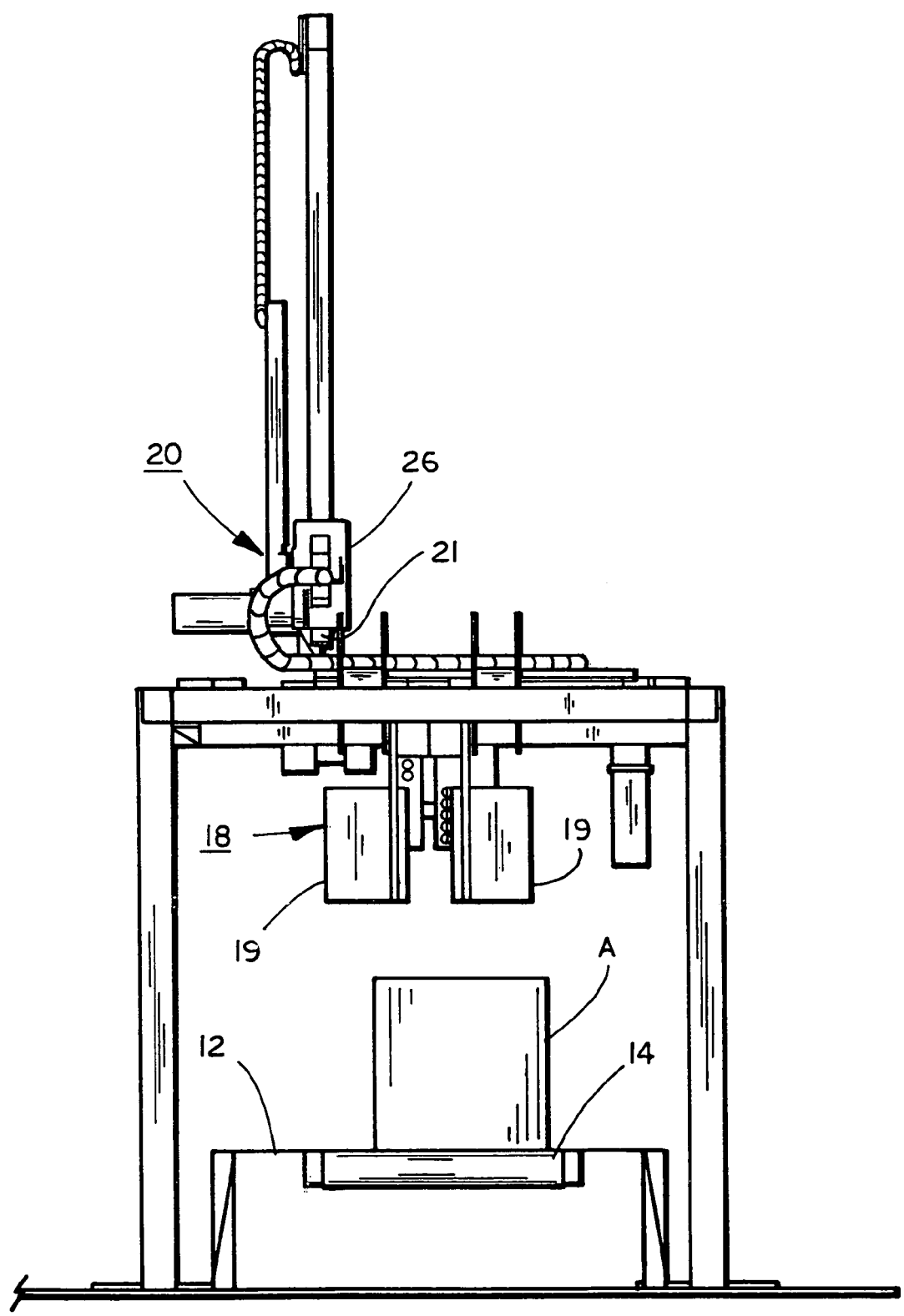
FIG. 4 is an end elevation of the apparatus in FIG. 4.

Referring now specifically to the drawings, and the illustrative embodiments depicted therein, a label application system, or apparatus, 10 includes a label application apparatus 16 having a dispenser assembly 18 for dispensing a plurality of different types of labels and an applicator 20 for transporting a dispensed label and applying the label to an article A (FIGS. 1-4). Article A is being conveyed by a conveying surface 14 of a conveyor 12. A code reader, such as a barcode scanner 22, reads any barcode label, which may be a one-dimensional line type barcode or a two-dimensional barcode, and conveys that information to a control (not shown). The code reader may alternatively optically recognize text and other characters. The control includes a database which, as is conventional, relates the barcode identified by barcode scanner 22 with a stock-keeping unit (SKU) as well as other information about the article, such as its weight, size, and the like. In addition, the database also relates a label type, such as an RFID tag type, with that SKU corresponding with the barcode. The database may be set up based upon the known electromagnetic characteristics of each particular SKU. In particular, certain SKUs may be identified as corresponding to articles which may interfere with the radio frequency emissions of an RFID tag. Such SKUs would be associated with an RFID tag of a particular type, such as a high performance RFID tag. Likewise, the articles corresponding to the SKU may have characteristics that do not substantially interfere with the transmission of radio frequency signals. The database may associate a different type of RFID tag with SKUs having such non-interfering materials. For example, the RFID tag associated with such non-interfering article may be of a lower performance RFID tag which may emit radio frequency signals which are more easily interfered with. Thus, the control reads the barcode information from barcode scanner 22, applies that information to the database and looks up the type of RFID tag assigned to that article A. Other techniques for identifying the article may be used, such as having information in the control of the order in which articles are arranged in a queue on the conveying surface. The control may be part of a warehouse management system of the type supplied by Siemens Dematic Corp. of Grand Rapids, Mich.

The control controls dispenser assembly 18 in order to dispense the type of tag determined by the control to be applied to the particular article. In the illustrative embodiment, dispenser assembly 18 includes multiple dispensers 19, each having a label reel 24 containing different types of RFID or barcode tags. Transporter 20 includes a head 21, such as a suction head, which is known in the art, that may be selectively positioned adjacent the reel 24 having the selected RFID tag. Once the tag is received from the reel, transporter 20 moves head 21 vertically in order to apply the tag to article A. Thus, it is seen that transporter 20 is a two-dimensional transporter, utilizing a two-axis servo actuator 26. Two-axis servo actuator 26 may be of the type used in automatic storage and retrieval systems of the type marketed by Siemens Dematic Corp. of Grand Rapids, Mich.

Figure 8A:
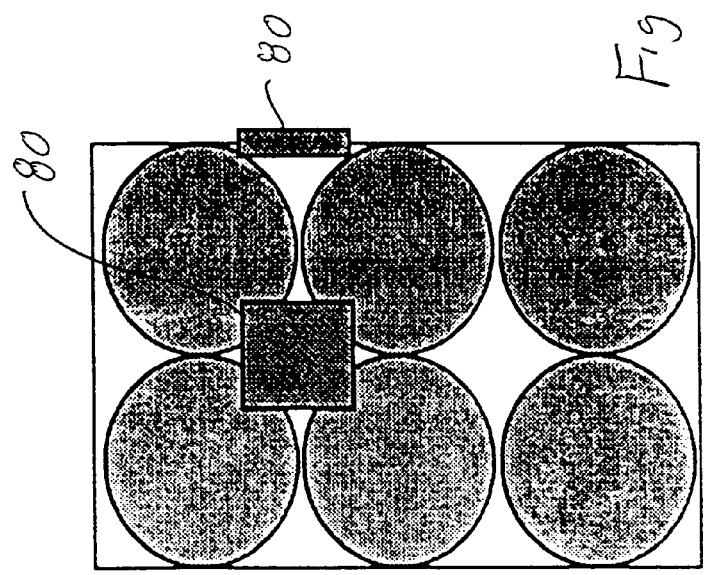
FIGS. 8a and 8b are top plan views of a case of metal cans illustrating placement of RFID tags with respect to the case.
Figure 8B:
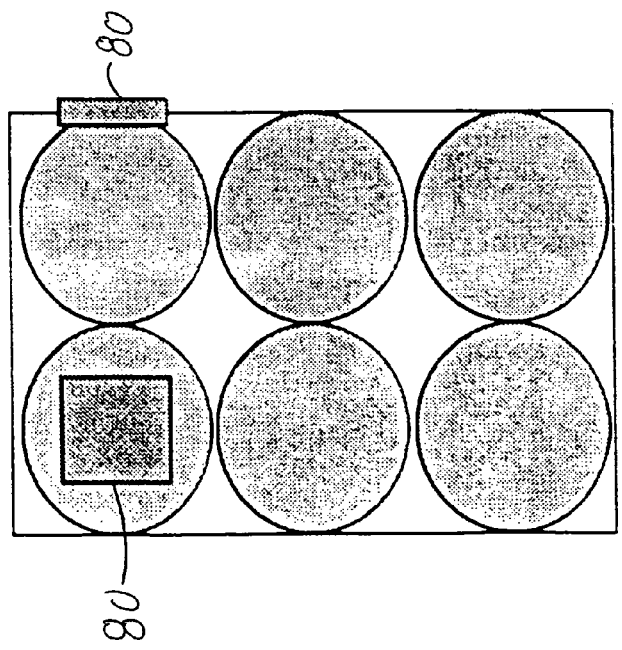

In addition to selecting an RFID tag from the appropriate label reel 24, two-axis servo 26 is capable of laterally positioning head 21 with respect to conveying surface 14. This may be useful in positioning the label on a certain location on the article A, notwithstanding lateral uncertainty in the positioning of the article. This may be facilitated by a scanner (not shown) that identifies the lateral positioning of the article on conveying surface 14, thereby identifying the lateral location required for the tag. In addition to accommodating uncertainty in article positioning, two-axis servo 26 allows placement at a position on the article to reduce interference with RFID performance due to liquids and metals. For example, an RFID tag 80 may be placed generally between metal cans, as illustrated in FIG. 8a, rather than directly over the metal can, as illustrated in FIG. 8b.

Each dispenser 19, may have the capability of not only dispensing a label or tag, but also printing indicia on the tag. Thus, the dispenser 19 may print, by way of example, a barcode on the RFID tag, or a blank label, to be applied to the article. The printed tag or label may identify either the type of tag, or other information about the tag or the article. Likewise, the dispenser 19 may include an electronic writing device in order to write code to the selected RFID tag. For example, RFID tags may include an Electronic Product Code (EPC) which includes not only the information provided with a conventional Uniform Product Code (UPC) associated with barcodes, but also a unique serial number for the article. Dispenser 19 may include the capability of writing an EPC to the RFID tag.

Figure 5:
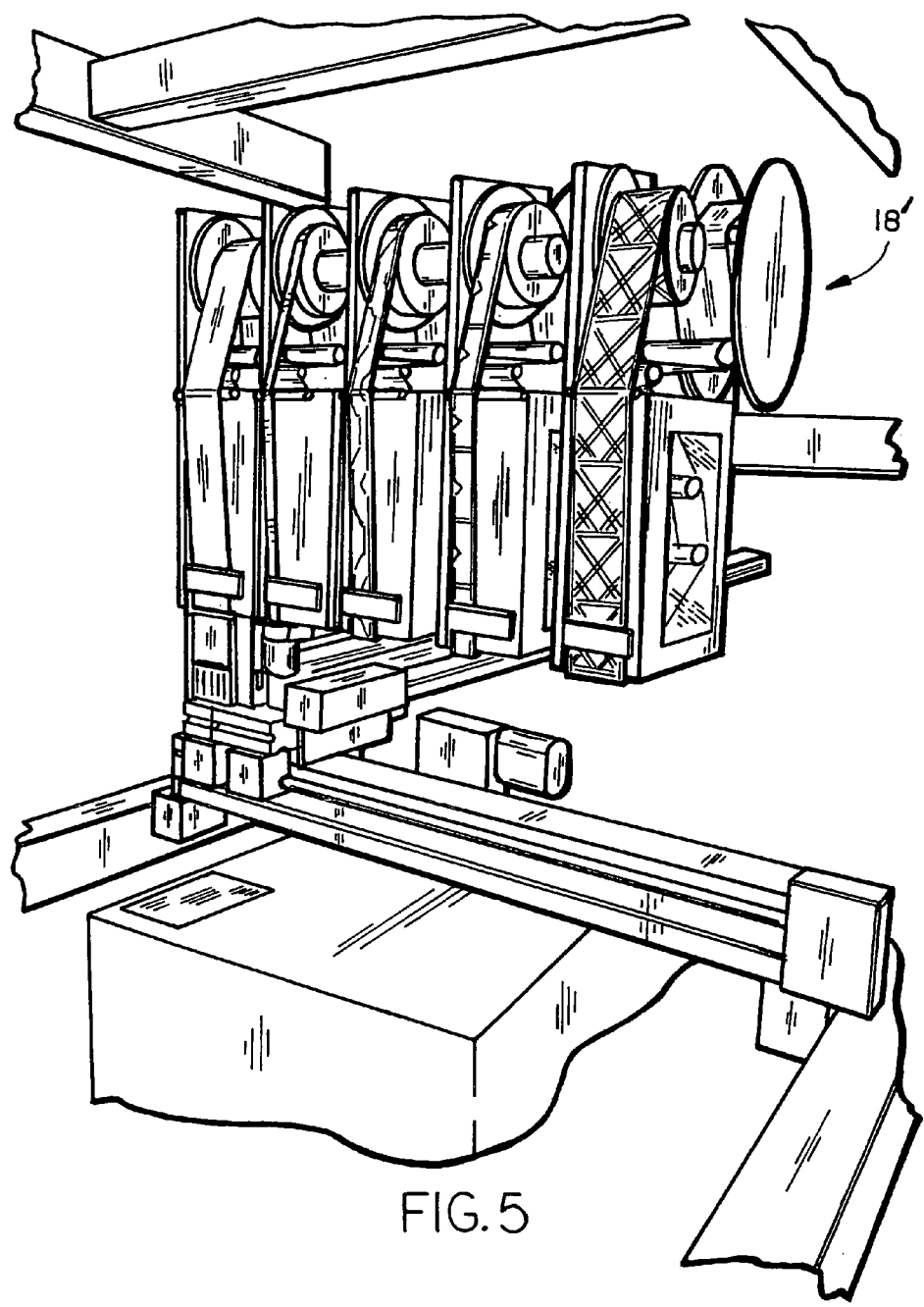
FIG. 5 is a perspective view of a dispenser, according to the invention.

While dispenser assembly 18 is illustrated as having multiple dispensers 19, in an alternative embodiment shown in FIG. 5, a single dispenser 18' may be capable of dispensing multiple different types of labels. Such a dispenser may include two or more different reels that are dispensed with a single dispenser. Where dispenser assembly 18, 118' is capable of dispensing multiple different types of tags from a single dispenser, transporter 20 may be a single axis, or dimension, transporter capable of vertical motion to transport the dispensed tag from the dispenser assembly to the article. While dispenser assembly 18, 118' may be utilized solely to dispense different types of RFID tags, it may also be used to dispense different types of tags, such as an RFID tag, a barcode label, or both. Likewise, dispenser assembly 18 may dispense different types of RFID tags and a barcode label. A detail of dispenser assembly 14 is illustrated in FIG. 5, wherein the head 21 of the transporter is seen being capable of lateral motion from juxtaposition with each of dispensers 19.

Figure 6:
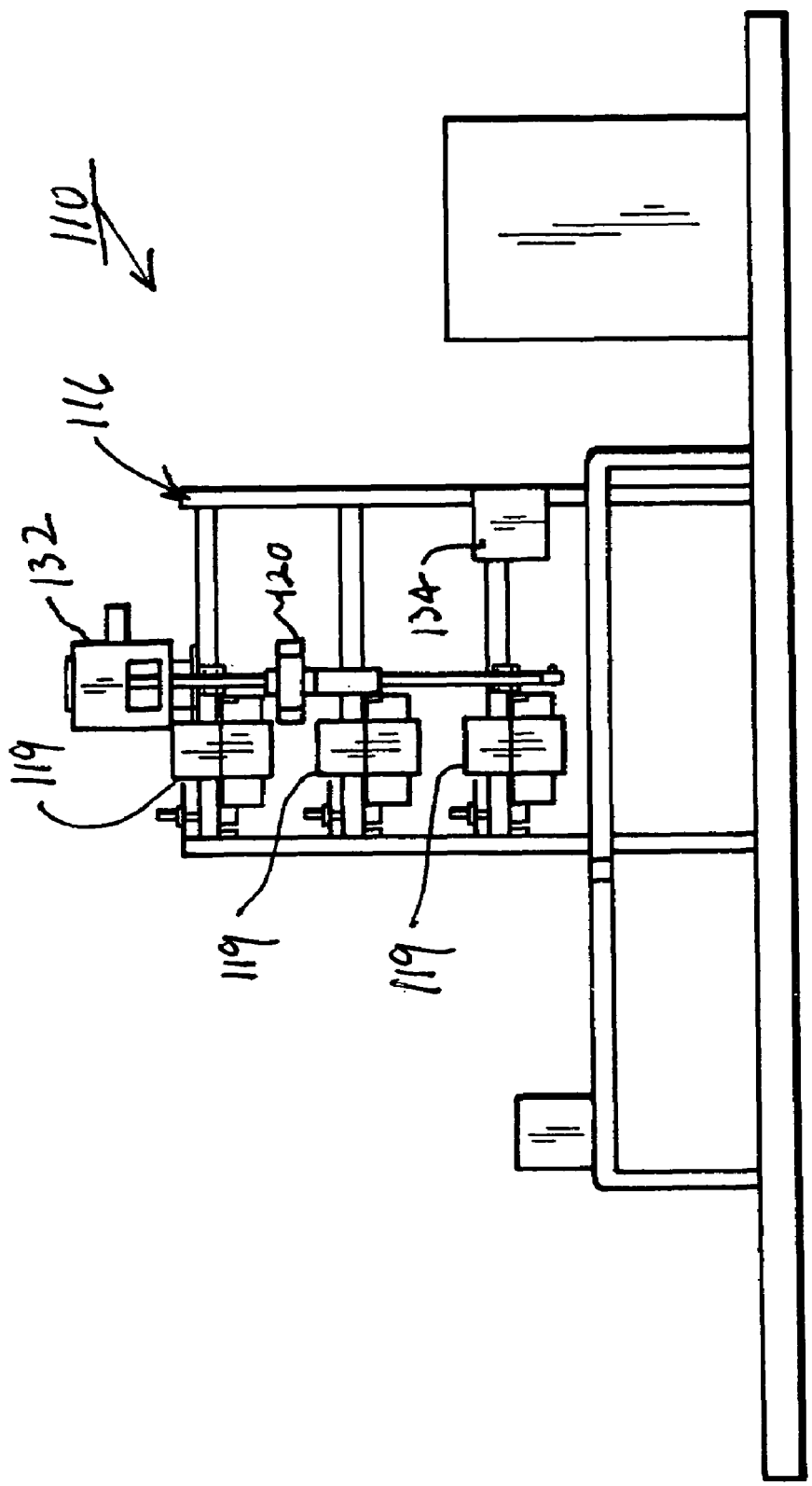
FIG. 6 is a side elevation of an alternative embodiment of a label application apparatus.
Figure 7:
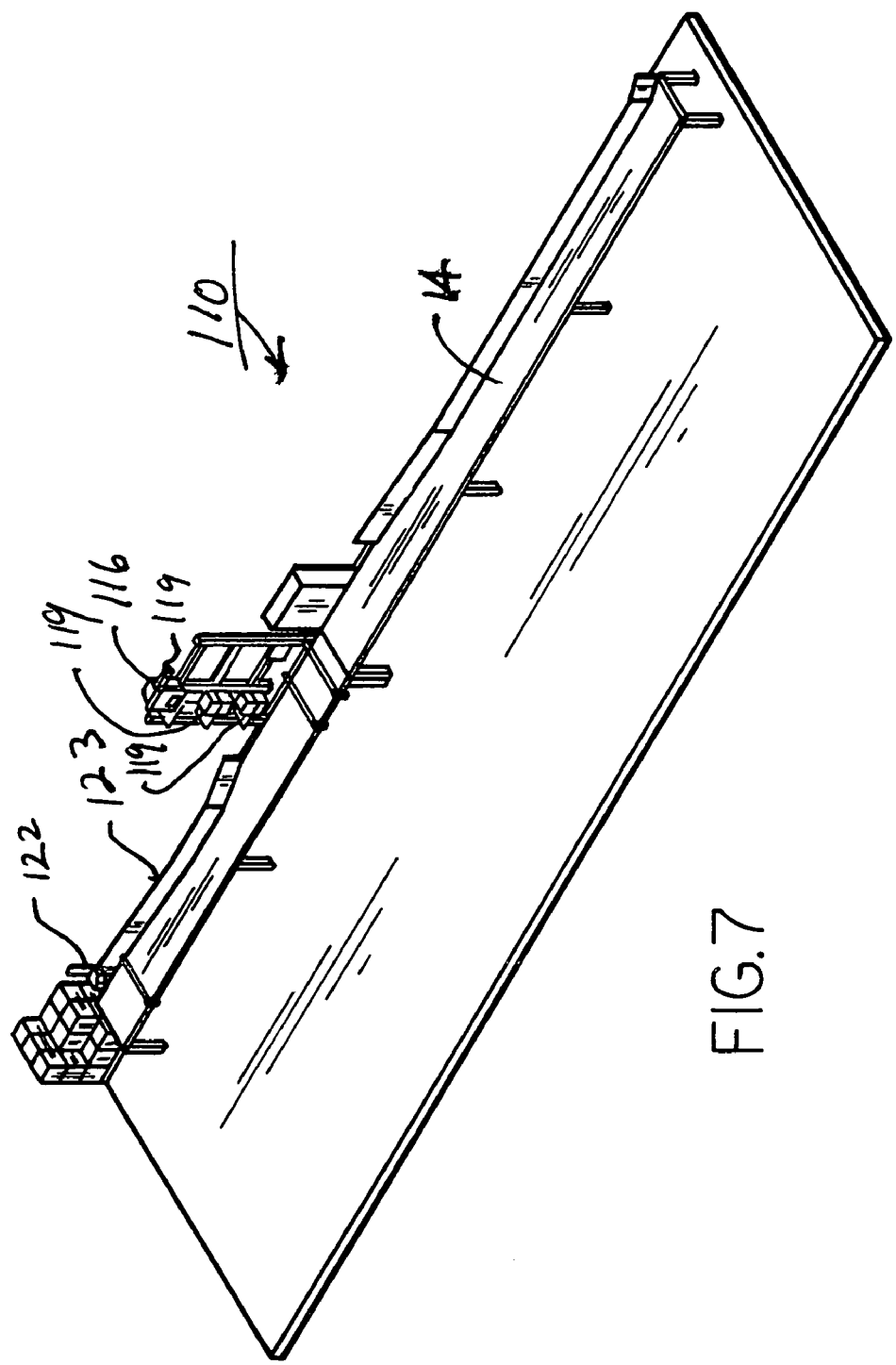
FIG. 7 is a perspective view of the apparatus in FIG. 6.

FIGS. 6 and 7 illustrate a label application system 110 which is capable of applying labels and tags to the side of the article. System 110 includes a scanner 122 for scanning barcodes or performing optical character recognition on incoming articles. The articles are edge aligned using conventional rails 123. A label application apparatus 116 may include a dispenser assembly 118 with a plurality of label dispensers 119. Each label dispenser 119 may include a printer for applying indicia to the label and an RFID label reader/writer and/or verifier device 132 for reading, writing and or verifying data on RFID tags. Device 132 may also have the capability of collecting unreadable RFID tags. Label applicator 10 may include a combination transporter and application 120 for vertically positioning and applying a particular type of RFID tag. By suitable controls, the tag or label can be positioned with respect to both the vertical as well as the horizontal location on the article. A reader/verifier 134 may be used to verify the label or tag on the article.

Thus, it is seen that the present invention provides the ability to select a specific type of RFID and selectively position the tag on the article or carton. A plane optical label, such as a barcode label, can also be applied either alone or in combination with an RFID tag. The present invention is capable of achieving a high level of read rate at a low cost basis for the user.

Changes and modifications in the specifically described embodiments can be carried out without departing from the principles of the invention which is intended to be limited only by the scope of the appended claims, as interpreted according to the principles of patent law including the doctrine of equivalents.

The embodiments of the invention in which an exclusive property or privilege is claimed are defined as follows:

1. A method of applying radio frequency identification (RFID) tags to an article, comprising:

providing a conveyor having a conveying surface for conveying articles;

providing a label application apparatus having multiple label holders, and holding a plurality of different types of RFID tags with said label holders, at least some of said RFID tags having different radio frequency signal emitting capabilities than other of said RFID tags;

determining a characteristic of an article on said conveying surface that may affect a radio frequency signal emitted by an RFID tag;

controlling said label application apparatus to selectively retrieve at least one of said plurality of different types of RFID tags from one of said label holders as a function of the characteristic of the article; and applying the selected RFID tag to the article on said conveying surface.

2. The method of claim 1 wherein said determining a characteristic of an article comprises providing a database of article identifiers and information pertaining to the characteristic of that article that may affect radio frequency signals emitted by an RFID tag.

3. The method of claim 2 wherein said determining a characteristic of an article further comprises determining the article identifier for that article and applying that article identifier to the database.

4. The method of claim 3 wherein said article identifier comprises a product barcode.

5. The method of claim 4 wherein said determining a characteristic of an article further comprises reading the product barcode as the article is being conveyed by said conveying surface.

6. The method of claim 1 further including applying the selected RFID tag to a particular location on the article as a function of the characteristic of the article.

7. A labeling system for applying radio frequency identification (RFID) tags to an article, comprising:
   a conveyor having a conveying surface for conveying articles;
   a label application having multiple label holders, said multiple label holders adapted to holding different types of RFID tags, at least some of said RFID tags having different radio frequency signal emitting capabilities than other of said RFID tags, said label application apparatus adapted to selectively retrieve an RFID tag from one of said label holders;
   a control, said control determining a characteristic of an article on said conveying surface that may affect a radio frequency signal emitted by an RFID tag;
   said control retrieving at least one of said plurality of different types of RFID tags from said at least one of said label holders as a function of the characteristic of the article, and controlling said label application apparatus to apply the retrieved RFID tag to the article on said conveying surface.

8. The system of claim 7 wherein said control includes a database of article identifiers and information pertaining to the characteristic of that article that may affect radio frequency signals emitted by an RFID tag.

9. The system of claim 8 wherein said control determines the article identifier for that article and applying that article identifier to the database.

10. The system of claim 9 wherein said article identifier comprises a product barcode.

11. The system of claim 10 including a scanner, said control determining a characteristic of an article by reading the product barcode with said scanner as the article is being conveyed by said conveying surface.

12. The system of claim 8 wherein said control controls said label application apparatus to apply the selected RFID tag to a particular location on the article as a function of the characteristic of the article.

* * * * *